United States Patent
Shigematsu

(10) Patent No.: US 7,804,357 B2
(45) Date of Patent: Sep. 28, 2010

(54) DISTRIBUTED AMPLIFIER

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/238,064

(22) Filed: Sep. 29, 2005

(65) Prior Publication Data

US 2006/0279360 A1    Dec. 14, 2006

(30) Foreign Application Priority Data

Jun. 8, 2005    (JP)    ............... 2005-168452

(51) Int. Cl.
H03F 3/26    (2006.01)

(52) U.S. Cl. .................. 330/55; 330/286; 330/307; 330/269; 330/262

(58) Field of Classification Search .......... 330/55, 330/1, 286, 307, 269, 262
See application file for complete search history.

(56) References Cited

U.S. PATENT DOCUMENTS

| | | | |
|---|---|---|---|
| 4,446,445 A | | 5/1984 | Apel |
| 4,540,954 A | | 9/1985 | Apel |
| 4,675,911 A | | 6/1987 | Sokolov et al. |
| 4,797,628 A | | 1/1989 | Gruchalla et al. |
| 5,227,734 A | * | 7/1993 | Schindler et al. ............ 330/54 |
| 5,311,150 A | * | 5/1994 | Engbretson et al. .......... 331/59 |
| 5,550,513 A | | 8/1996 | Wong |
| 6,064,258 A | * | 5/2000 | Shulman ..................... 330/9 |
| 6,242,807 B1 | | 6/2001 | Kazami |

| | | | |
|---|---|---|---|
| 2004/0080041 A1 | | 4/2004 | Kimura |
| 2006/0279360 A1 | * | 12/2006 | Shigematsu ................. 330/286 |

FOREIGN PATENT DOCUMENTS

| | | |
|---|---|---|
| CA | 2 236 993 C | 8/2000 |
| EP | 0 196 098 A2 | 10/1986 |
| JP | 36-23108 | 11/1961 |
| JP | 61-270906 | 12/1986 |
| JP | 62-109411 | 5/1987 |
| JP | 6-80984 B2 | 10/1994 |
| JP | 7-24372 B2 | 3/1995 |
| JP | 10-199882 A | 7/1998 |
| JP | 10-510970 | 10/1998 |
| JP | 11-238734 A | 8/1999 |
| JP | 2002-110902 A | 4/2002 |
| JP | 2004-140286 A | 5/2004 |

OTHER PUBLICATIONS

Xreference Definition of Transmission line, Academic Press Dictionary of Science and Technology 1992.*
Jong-Wook Lee et al., "A Broadband GaN Push-Pull Distributed Microwave Power Amplifier", Semiconductor Device Research Symposium, 2001 International, Piscataway, NJ, USA, IEEE, Dec. 5-7, 2001, pp. 391 and 393.
Office Action dated Aug. 12, 2008, 7 pages.

* cited by examiner

*Primary Examiner*—Michael B Shingleton
(74) *Attorney, Agent, or Firm*—Arent Fox LLP

(57) ABSTRACT

In order to allow to make compact a distributed amplifier by dispensing with any choke coil and reduce its cost, the distributed amplifier is configured such that it comprises an input side transmission line, an output side transmission line, and plural amplifier circuits connected to the input side transmission line and the output side transmission line, wherein push-pull amplifier circuits are employed as the amplifier circuits.

16 Claims, 8 Drawing Sheets

DISTRIBUTED AMPLIFIER

CROSS REFERENCE TO RELATED APPLICATIONS

This application is based on and hereby claims priority to Japanese Application No. 2005-168452 filed on Jun. 8, 2005, 2005 in Japan, the contents of which are hereby incorporated by reference.

BACKGROUND OF THE INVENTION (1) Field of the Invention

The present invention relates to a distributed amplifier suitable for use in a high frequency circuit for a GHz band provided for super high-speed optical communication or high-speed radio communication.

(2) Description of Related Art

Recently, the rapid spread of the Internet has led to an increased demand for a wide band communication system capable of transmitting and receiving a large amount of data at a high-speed. In order to realize such a communication system, there is a demand for a wide band amplifier having a high frequency band exceeding 10 GHz at the transmitting section front end and the receiving section front end.

On the other hand, a distributed amplifier is used in the field of optical communication and high frequency radio communication as a circuit component suitable for a wide band since its band is determined by the input capacity of a transistor as well as the inductance component of a transmission line.

Based upon the technical investigation of the prior arts, the following Japanese Examined Patent Application Publication HEI 7-24372 and Japanese Examined Patent Application Publication HEI 6-80984 have been resultantly found.

SUMMARY OF THE INVENTION

The configuration of a conventional distributed amplifier is such that, as shown in FIG. 8 for example, plural amplifier circuits 102 (here, field-effect transistors; FETs) are connected in parallel between an input side transmission line 100 and an output side transmission line 101. In FIG. 8, symbol 103 denotes blocks showing inductance components of the transmission lines 100 and 101. Further, a unit cell 104 is configured such that it includes the input side transmission line 100 including one FET 102 and two inductance components (L/2) and the output side transmission line 101 including two inductance components (L/2).

Then, one end of the input side transmission line 100 is connected to an input terminal IN and the other end is grounded via a terminal resistor 105. On the other hand, one end of the output side transmission line 101 is connected to an output terminal OUT via a bias circuit 106 and the other end is grounded via a terminal circuit 107.

Here, the bias circuit 106 comprises a capacitor 106A and a choke coil 106B and has a configuration in which one end of the capacitor 106A and one end of the choke coil 106B are connected. Then, the other end of the capacitor 106A is connected to the output terminal OUT and the other end of the choke coil 106B is connected to a bias voltage power source (a bias voltage Vdd).

The configuration of the terminal circuit 107 is such that a terminal resistor 107A and a capacitor 107B are connected in series.

As described above, the conventional distributed amplifier has a problem in that the choke coil 106B has large occupation area since the bias circuit 106 comprising the choke coil 106B is provided on the output terminal OUT side of the output side transmission line 101 in order to operate the circuit. There is also another problem in that the mounting cost is increased since there is a need for the expensive choke coil 106B having an inductance of mH class.

The present invention has been devised in view of these problems and an object thereof is to provide a distributed amplifier capable of being made compact (miniaturization) by dispensing with any choke coil and of reducing the cost.

In accordance with one aspect of the present invention, a distributed amplifier comprising an input side transmission line, an output side transmission line, and plural amplifier circuits connected to the input side transmission line and the output side transmission line, wherein the amplifier circuits are push-pull amplifier circuits.

Therefore, according to the distributed amplifier of the present invention, there is an advantage that a choke coil can be dispensed with to make the amplifier compact and that the cost can be reduced.

DESCRIPTION OF THE PREFERRED EMBODIMENTS

A distributed amplifier according to embodiments of the present invention is explained below with reference to drawings.

First Embodiment

First, a distributed amplifier according to a first embodiment of the present invention is explained below with reference to FIG. 1 to FIG. 4.

Figure 1:
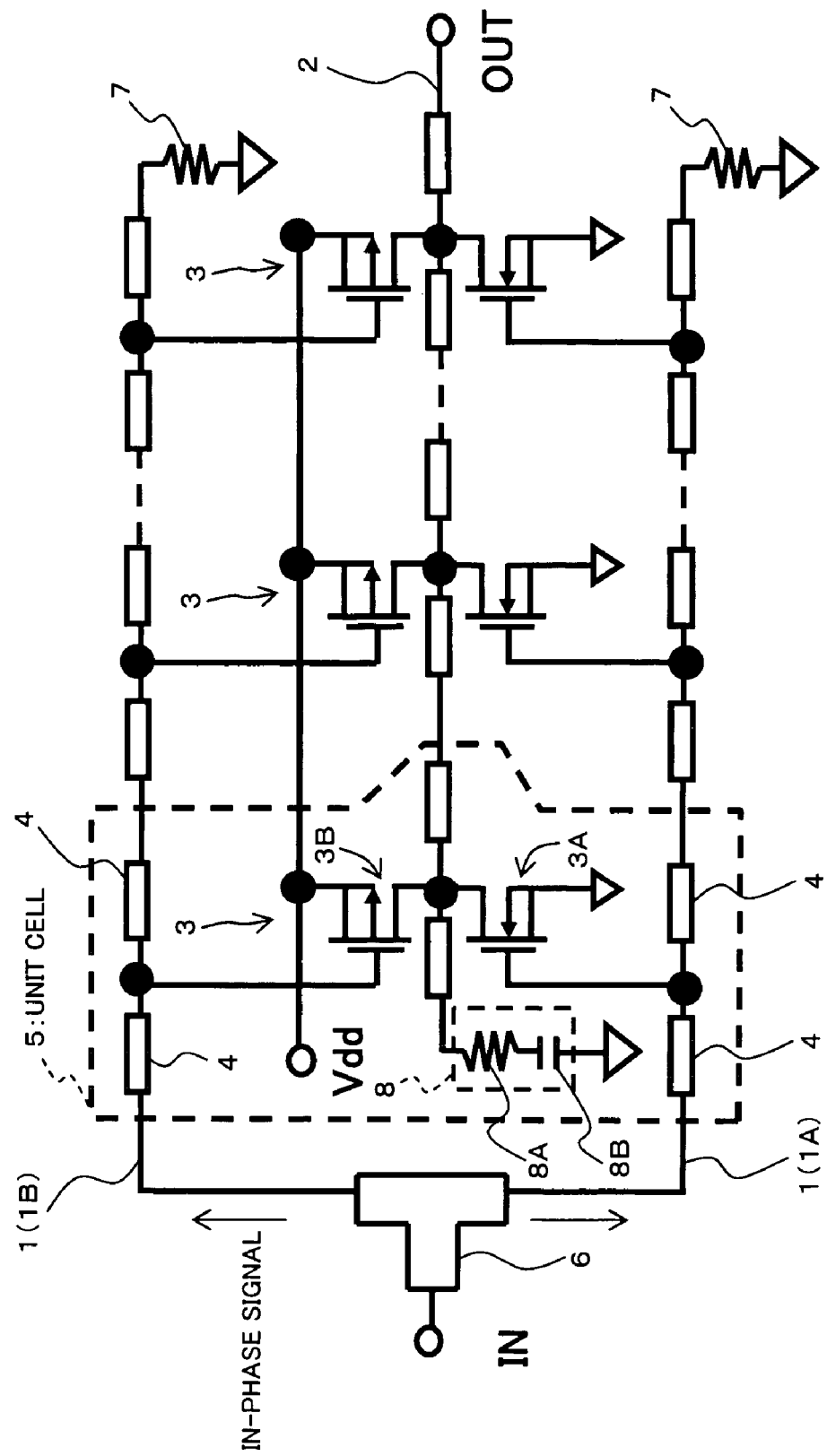
FIG. 1 is a schematic diagram showing a configuration of a distributed amplifier according to a first embodiment of the present invention.
Figure 2:
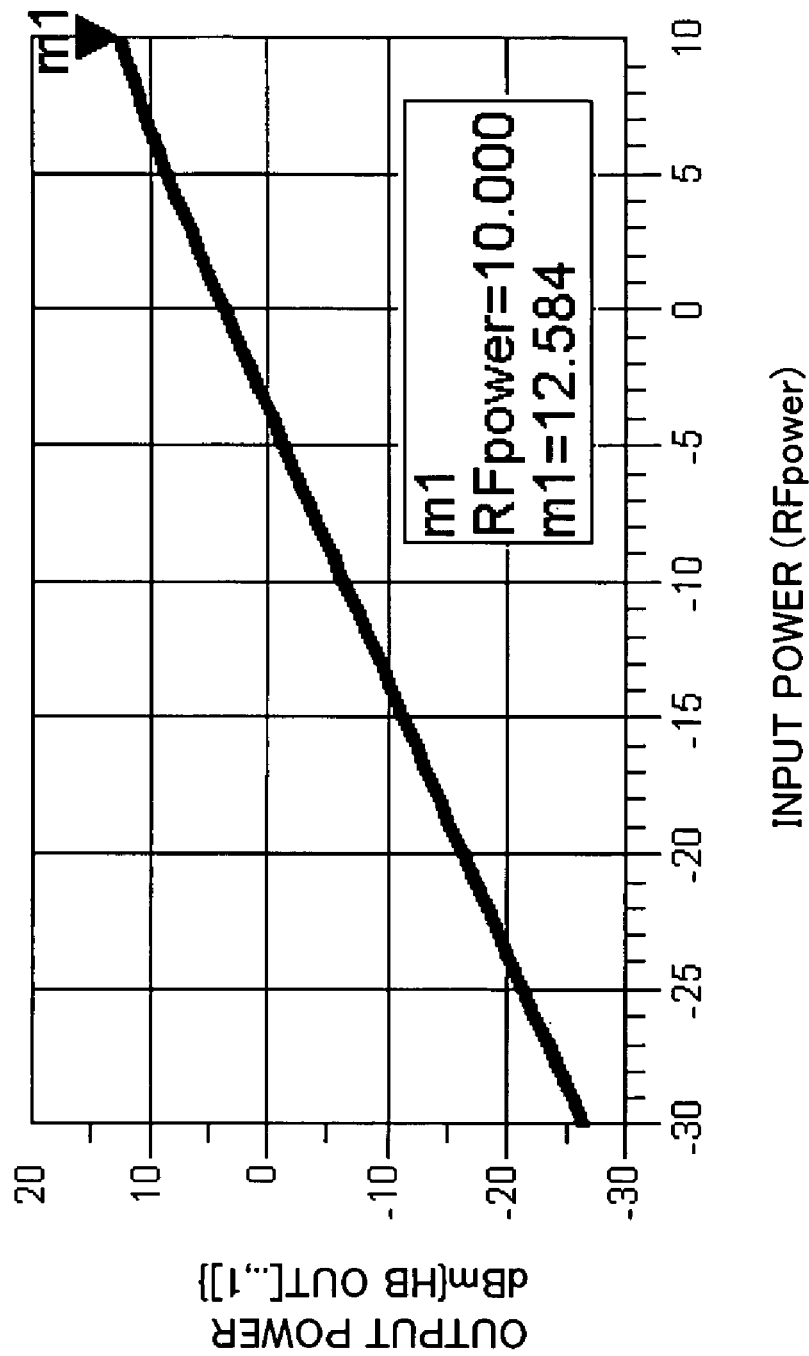
FIG. 2 is a diagram for explaining the effects of the distributed amplifier according to the first embodiment of the present invention.
Figure 3:
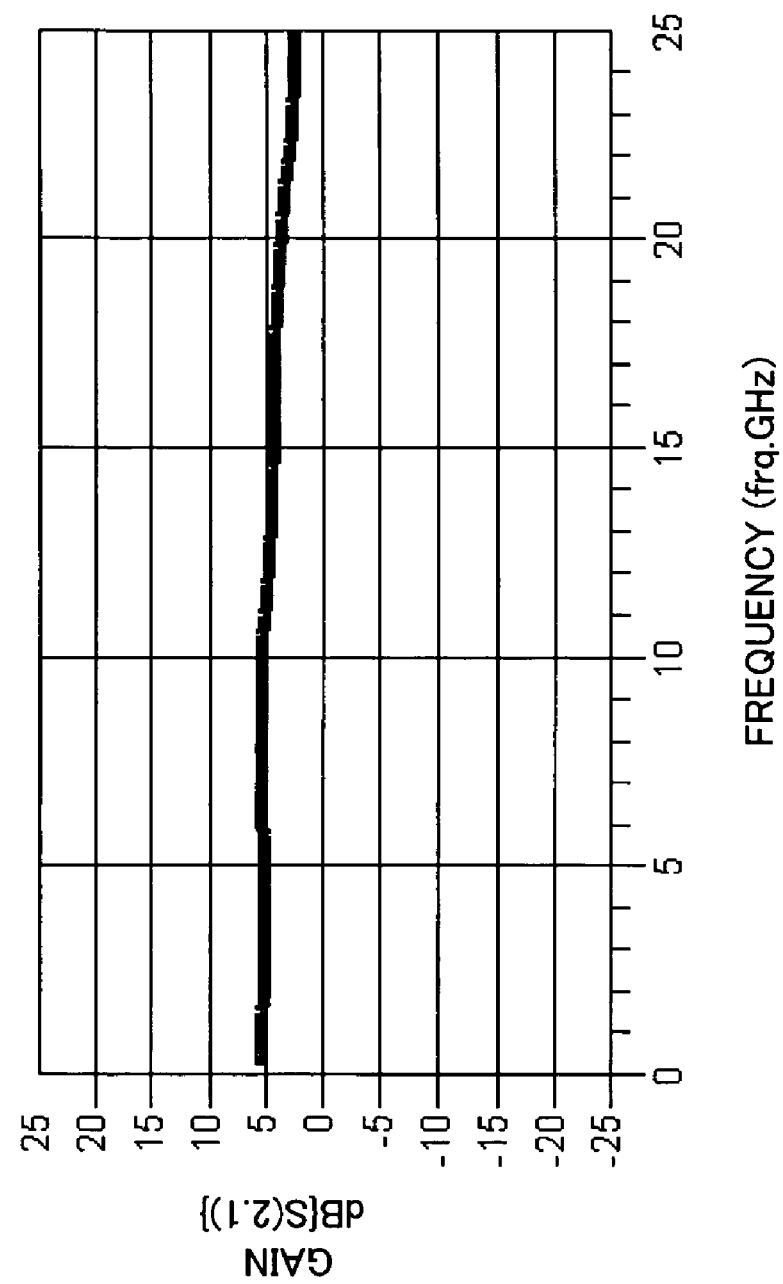
FIG. 3 is a diagram for explaining the effects of the distributed amplifier according to the first embodiment of the present invention.
Figure 4:
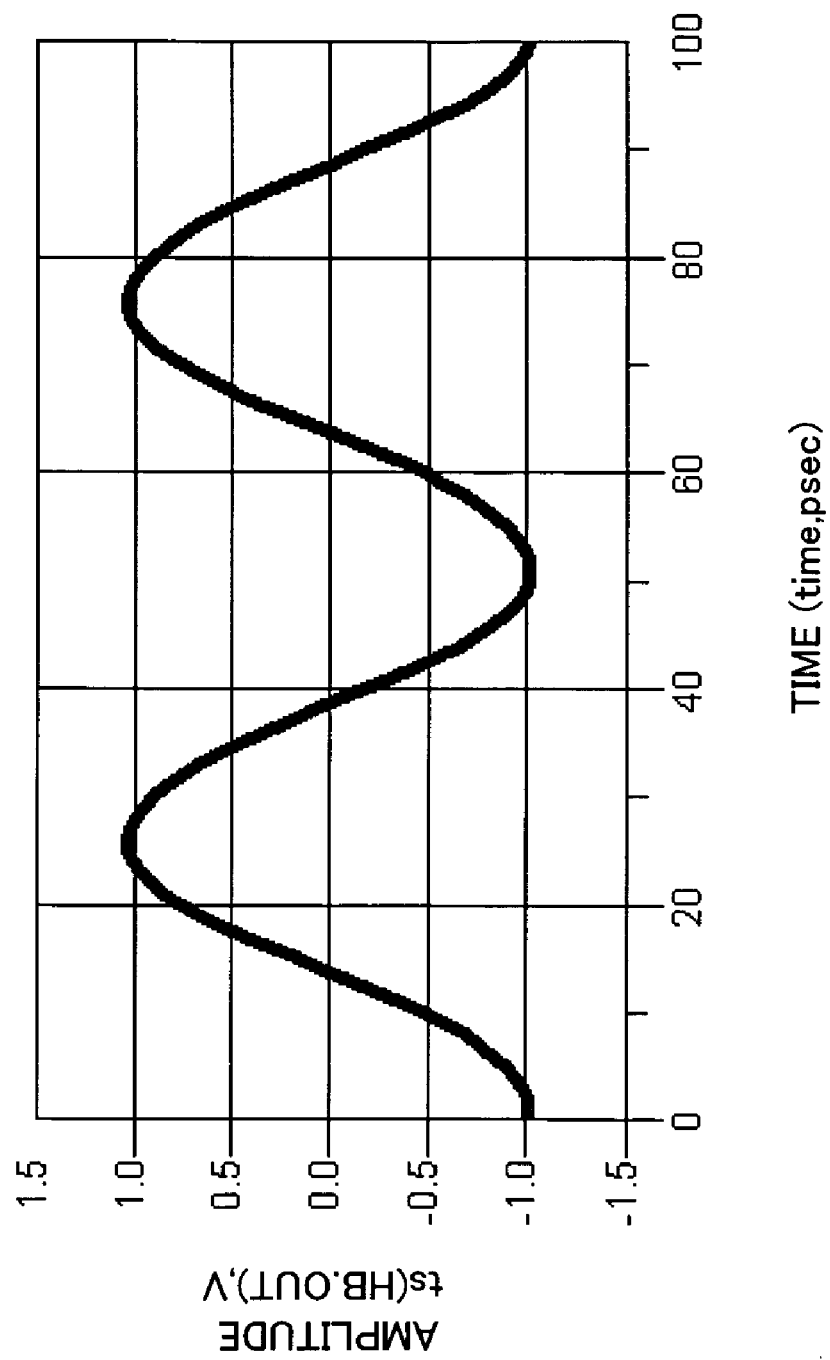
FIG. 4 is a diagram for explaining the effects of the distributed amplifier according to the first embodiment of the present invention.

A distributed amplifier according to the present embodiment is configured such that, as shown in FIG. 1, for example, an input side transmission line 1, an output side transmission line 2, and plural amplifier circuits 3 connected to the input side transmission line 1 and the output side transmission line 2, all being connected in parallel.

In FIG. 1, symbol 4 denotes blocks showing the inductance components of the transmission lines. Further, a unit cell 5 is configured such that it includes the input side transmission line 1 including one of the amplifier circuits 3 and two inductance components (L/2) 4 and the output side transmission line 2 including the two inductance components (L/2) 4. Accordingly, the present distributed amplifier is configured such that plural unit cells are connected.

In the present embodiment, each of the plural amplifier circuits 3 is a push-pull amplifier circuit.

Here, each of the plural push-pull amplifier circuits 3 is a complementary push-pull amplifier circuit comprising an n-channel type transistor (a push side transistor) 3A and a p-channel type transistor (a pull side transistor) 3B. In other words, the push-pull amplifier circuit is a complementary push-pull amplifier circuit comprising two transistors of different types (transistors in which channels of different conduction types are formed).

The n-channel type transistor 3A is an n-channel type MOS field-effect transistor (FET) (nMOSFET) and the p-channel type transistor 3B is a p-channel type MOS field-effect transistor (FET) (pMOSFET). Here, the transistor is a MOS type FET, however, it may be another FET such as a junction type FET or a MIS (Metal Insulator Semiconductor) type FET.

In the present embodiment, there are provided a push side input transmission line 1A for inputting a signal to the n-channel type transistor 3A and a pull side input transmission line 1B for inputting a signal to the p-channel type transistor 3B as the input side transmission line 1. In other words, in the present embodiment, since there are provided the two transistors, that is, the n-channel type transistor 3A and the p-channel type transistor 3B, the two input side transmission lines 1A and 1B are provided for inputting signals to the transistors 3A and 3B, respectively.

Then, one end of each of the input side transmission lines 1A and 1B is connected to the input terminal IN via a divider (for example, a resistance type divider; Lange coupler etc.) 6. In other words, the divider 6 is provided on the input sides of the push side input transmission line 1A and the pull side input transmission line 1B and the input signals to be inputted via the input terminal IN are divided to the push side and the pull side such that in-phase input signals (in-phase signals) are inputted to the push side n-channel type transistor 3A and the pull side p-channel type transistor 3B (single phase type distributed amplifier).

The other end of each of the input side transmission lines 1A and 1B is grounded via a terminal resistor 7. It is possible to freely set the resistance of the terminal resistor 7. Here, the terminal resistor 7 is provided in the input side transmission lines 1A and 1B, respectively, but the configuration is not limited to this and it is possible to integrate the two input side transmission lines 1A and 1B into one transmission line and to integrate the terminal resistors 7 into one resistor by providing the terminal resistor 7 in the integrated transmission line. However, in the case of a push-pull configuration comprising the n-channel type transistor 3A and the p-channel type transistor 3B, since there is a need to prevent variations in the parameters (for example, input capacity) of the respective transistors 3A and 3B from occurring, it is preferable to provide a terminal resistor in the two input side transmission lines 1A and 1B, respectively.

On the other hand, in the present embodiment, one output side transmission line is provided between the n-channel type transistor 3A and the p-channel type transistor 3B as the output side transmission line 2 (single end distributed amplifier). In other words, in the present embodiment, a signal amplified by the n-channel type transistor 3A and a signal amplified by the p-channel type transistor 3B are combined and outputted via the common output side transmission line 2.

Here, one end of the output side transmission line 2 is connected to the output terminal OUT and the other end is grounded via a terminal circuit 8. Here, the terminal circuit 8 is configured such that a terminal resistor 8A and a capacitor 8B for preventing a direct current from flowing to the terminal resistor 8A are connected in series.

More specifically, in the present embodiment, the input side transmission line is connected to the gates of the pMOSFET 3B and the nMOSFET 3A, respectively. In other words, the pull side input transmission line 1B is connected to the gate of the pMOSFET 3B and the push side input transmission line 1A is connected to the gate of the nMOSFET 3A. Here, each of the input side transmission lines 1A and 1B is connected to the input terminal IN via the divider 6 such that in-phase signals are inputted to the gates of the pMOSFET 3B and nMOSFET 3A (gate in-phase input).

Further, the output side transmission line 2 is connected to the source of the pMOSFET 3B and to the drain of the nMOSFET 3A. In other words, the source of the pMOSFET 3B and the drain of the nMOSFET 3A are connected together and to their connection point, the output side transmission line 2 is connected.

Furthermore, to the drain of the pMOSFET 3B, a constant-voltage power source capable of supplying a constant power source voltage Vdd is connected. On the other hand, the source of the nMOSFET 3A is grounded.

The present distributed amplifier is configured as described above, therefore, it operates as follows.

When input signals are inputted from the input terminal IN, the input signals are divided by the divider 6 to the two input side transmission lines 1 (the push side input transmission line 1A and the pull side input transmission line 1B), respectively.

Next, the respective in-phase signals divided by the divider 6 propagate on the respective input side transmission lines 1A and 1B and part of them is inputted to the plural amplifier circuits 3, respectively. Here, one of the input signals propagates on the push side input transmission line 1A and part of it is applied to the gates of the plural nMOSFETs 3A, respectively. On the other hand, the other input signal propagates on the pull side input transmission line 1B and part of it is applied to the gates of the plural pMOSFETs 3B, respectively.

In the present embodiment, since the amplifier circuit has a complementary push-pull configuration comprising the n-channel type transistor (nMOSFET) 3A and the p-channel type transistor (pMOSFET) 3B (that is, the unit cell 5 is configured in such a manner as to include the pMOSFET 3B and the nMOSFET 3A), only the half waves on the upper side or the lower side of the input signal are amplified in the respective transistors 3A and 3B, and these are combined and taken out from between the pMOSFET 3B and the nMOSFET 3A as output signals. In this case, the power source voltage Vdd is supplied only to the drain of the pMOSFET 3B.

In this manner, the respective signals amplified by the respective amplifier circuits 3 propagate on the output side transmission line 2. Here, since the length of each path from the input terminal IN to the output terminal OUT is the same, the respective amplified signals being amplified by the respective amplifier circuits 3 and having propagated on the output side transmission line 2 are mutually in-phase at the output terminal OUT, combined and amplified, and output from the output terminal OUT as output signals.

Therefore, according to the distributed amplifier in the present embodiment, the choke coil for supplying a bias voltage required by the conventional distributed amplifier can be dispensed with and an advantage is obtained that it can be made compact and cost can be reduced. As a result, since the reduced occupied area of the distributed amplifier can be achieved, it becomes possible to realize very compact integrated circuit (IC) and module.

On the other hand, since each of the amplifier circuits has a push-pull configuration and the signals dealt with by the respective transistors 3A and 3B are either positive or negative, it is possible to increase the output that has been restricted in a conventional distributed amplifier due to the problem associated with the withstand voltage. As a result, as is apparent from the calculation results of the input/output power characteristics (Pin-Pout characteristics) shown in FIG. 2, a higher output is achieved and excellent linearity can be obtained. Further, as is apparent from the calculation results of the frequency characteristics of gain shown in FIG. 3, excellent gain flatness can be obtained in a wide band. And, as is apparent from the calculation results of the output waveform in FIG. 4, clipping can be alleviated and switching distortion can be eliminated by setting, for example, a bias etc. Furthermore, power consumption can be reduced compared to the conventional distributed amplifier.

Second Embodiment

Figure 5:
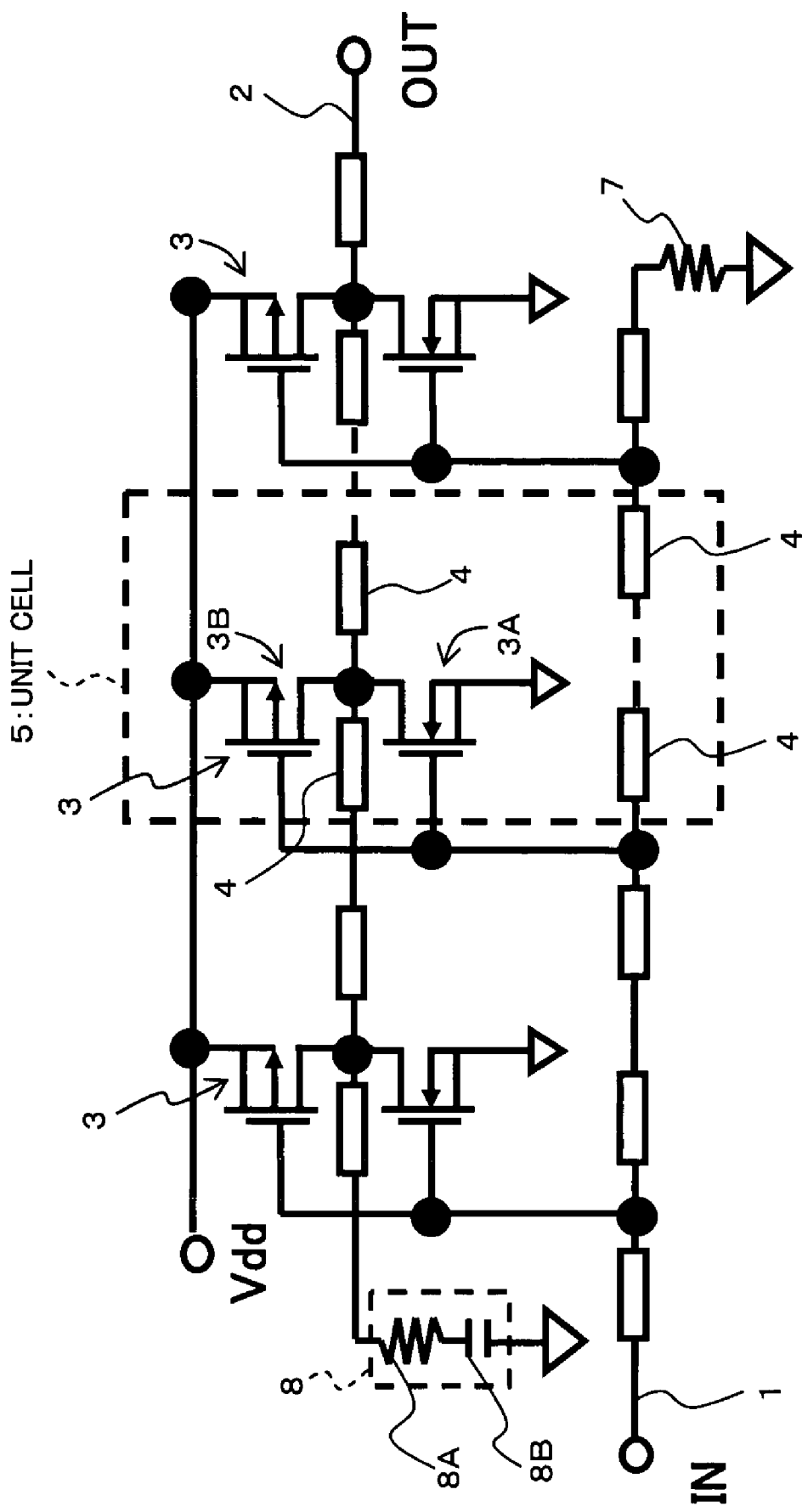
FIG. 5 is a schematic diagram showing a configuration of a distributed amplifier according to a second embodiment of the present invention.

Next, a distributed amplifier according to a second embodiment of the present invention is explained below with reference to FIG. 5.

The distributed amplifier according to the present embodiment differs from the one in the above-mentioned first embodiment in that the input side transmission line 1 is one line. In other words, the present distributed amplifier is different in that, as shown in FIG. 5, a common input side transmission line connected to both the n-channel type transistor 3A and the p-channel type transistor 3B is provided as the input side transmission line 1. Accordingly, the divider 6 provided in the above-mentioned first embodiment is not provided. In FIG. 5, the same symbols are attached to the same components as those in the above-mentioned first embodiment (refer to FIG. 1).

More specifically, the present distributed amplifier has a push-pull configuration in which the amplifier circuit 3 comprises the two transistors of different types (transistors in which channels of different conduction types are formed), that is, the n-channel type transistor (push side transistor) 3A and the p-channel type transistor (pull side transistor) 3B as is the case with the above-mentioned first embodiment. However, as shown in FIG. 5, one input side transmission line 1 is provided, which is connected to the respective transistors 3A and 3B, and thus in-phase input signals are inputted to the respective transistors 3A and 3B (single phase type distributed amplifier).

More concretely, in the present embodiment, the common input side transmission line 1 is connected to the gates of the pMOSFET 3B and the nMOSFET 3A such that in-phase signals are inputted to the gates of the pMOSFET 3B and the nMOSFET 3A (gate in-phase input).

Other configurations and operations are the same as those in the above-mentioned embodiment, therefore, the explanation will be omitted here.

Therefore, according to the distributed amplifier in the present embodiment, as in the above-mentioned first embodiment, the choke coil for supplying a bias voltage required by the conventional distributed amplifier can be dispensed with and an advantage is obtained that it can be made compact and cost can be reduced. As a result, since the reduced occupied area of the distributed amplifier can be achieved, it becomes possible to realize very compact integrated circuit (IC) and module.

On the other hand, since each of the amplifier circuits has a push-pull configuration and the signals dealt with by the respective transistors 3A and 3B are either positive or negative, it is possible to increase the output that has been restricted in a conventional distributed amplifier due to the problem associated with the withstand voltage. As a result, a higher output is achieved and excellent linearity can be obtained (refer to FIG. 2). Further, excellent gain flatness can be obtained in a wide band (refer to FIG. 3). And, clipping can be alleviated and switching distortion can be eliminated by setting, for example, a bias etc (refer to FIG. 4). Furthermore, power consumption can be reduced compared to the conventional distributed amplifier.

Third Embodiment

Next, a distributed amplifier according to a third embodiment of the present invention is explained below with reference to FIG. 6.

The distributed amplifier according to the present embodiment differs from that in the above-mentioned first embodiment in the configuration of the amplifier circuit.

Figure 6:
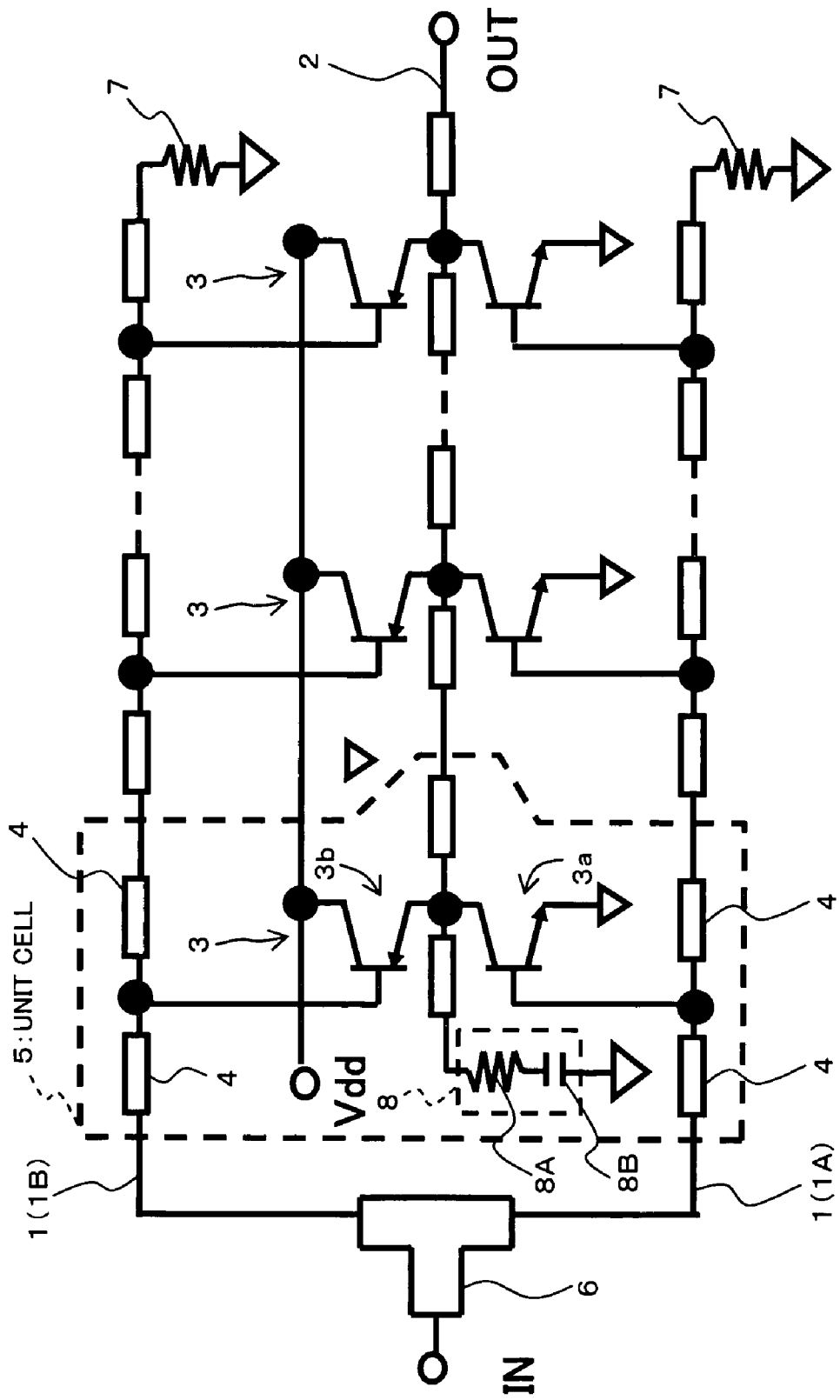
FIG. 6 is a schematic diagram showing a configuration of a distributed amplifier according to a third embodiment of the present invention.

In other words, as shown in FIG. 6, in the present distributed amplifier, each of the plural push-pull amplifier circuits 3 is configured as a complementary push-pull amplifier circuit comprising an npn bipolar transistor (push side transistor) 3a and a pnp bipolar transistor (pull side transistor) 3b. That is, the amplifier circuit 3 is a complementary push-pull amplifier circuit comprising two transistors of different types. Here, the base, source, and drain of the field-effect transistor in the above-mentioned first embodiment correspond to the base, emitter, and collector of the bipolar transistor, respectively. In FIG. 6, the same symbols are attached to the same components as those in the above-mentioned first embodiment (refer to FIG. 1).

Since other configurations and operations are the same as those in the above-mentioned first embodiment, no explanation will be given here.

Therefore, according to the distributed amplifier in the present embodiment, as in the above-mentioned first embodiment, the choke coil for supplying a bias voltage required by the conventional distributed amplifier can be dispensed with and an advantage is obtained that it can be made compact and cost can be reduced. As a result, since the reduced occupied area of the distributed amplifier can be achieved, it becomes possible to realize very compact integrated circuit (IC) and module.

On the other hand, since each of the amplifier circuits has a push-pull configuration and the signals dealt with by the respective transistors 3a and 3b are either positive or negative, it is possible to increase the output that has been restricted in a conventional distributed amplifier due to the problem associated with or the withstand voltage. As a result, a higher output is achieved and excellent linearity can be obtained (refer to FIG. 2). Further, excellent gain flatness can be obtained in a wide band (refer to FIG. 3). And, clipping can be alleviated and switching distortion can be eliminated by setting, for example, a bias etc (refer to FIG. 4). Furthermore, power consumption can be reduced compared to the conventional distributed amplifier.

Fourth Embodiment

Next, a distributed amplifier according to a fourth embodiment of the present invention is explained below with reference to FIG. 7.

The distributed amplifier according to the present embodiment differs from that in the above-mentioned second embodiment in the configuration of the amplifier circuit.

Figure 7:
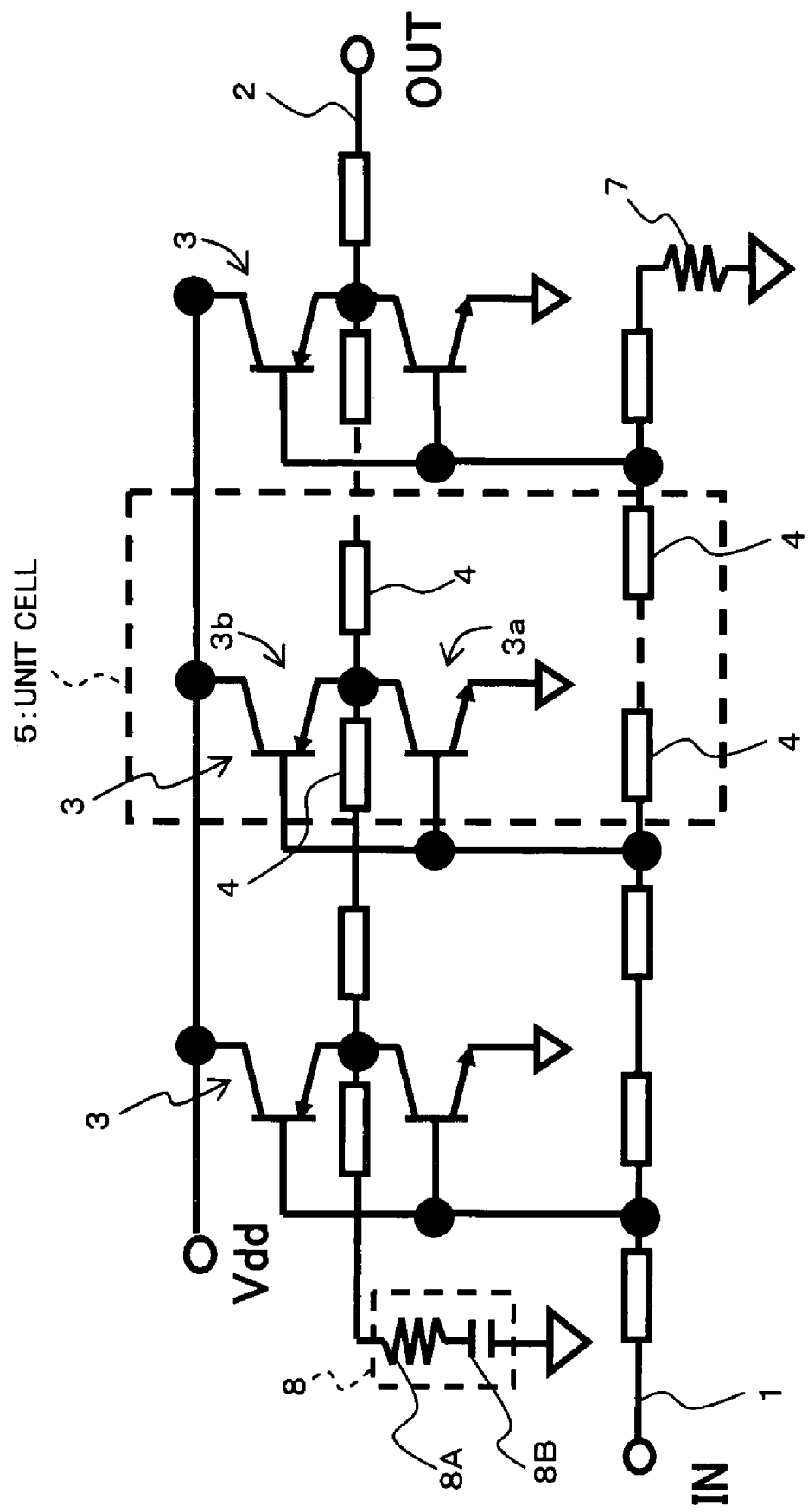
FIG. 7 is a schematic diagram showing a configuration of a distributed amplifier according to a fourth embodiment of the present invention.
Figure 8:
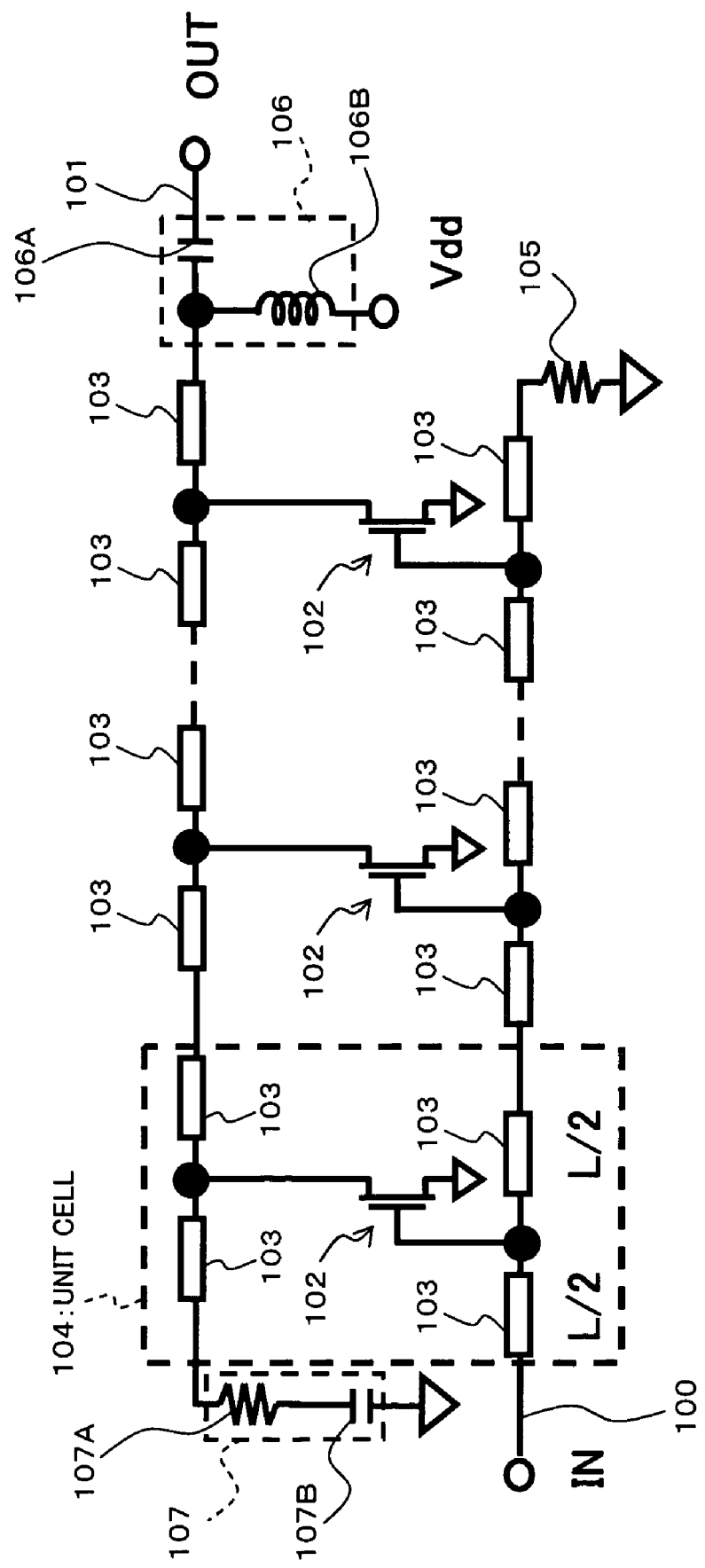
FIG. 8 is a schematic diagram showing a configuration of a conventional distributed amplifier.

In other words, as shown in FIG. 7, in the present distributed amplifier, each of the plural push-pull amplifier circuits 3 is configured as a complementary push-pull amplifier circuit comprising an npn bipolar transistor (push side transistor) 3a and a pnp bipolar transistor (pull side transistor) 3b. That is, the push-pull amplifier circuit 3 is a complementary push-pull amplifier circuit comprising two transistors of different types. Here, the base, source, and drain of the field-effect transistor in the above-mentioned second embodiment correspond to the base, emitter, and collector of the bipolar transistor, respectively. In FIG. 7, the same symbols are attached to the same components as those in the above-mentioned second embodiment (refer to FIG. 5).

Since other configurations and operations are the same as those in the above-mentioned second embodiment, no explanation will be given here.

Therefore, according to the distributed amplifier in the present embodiment, as in the above-mentioned second embodiment, the choke coil for supplying a bias voltage required by the conventional distributed amplifier is no longer necessary and an advantage is obtained that reduction both in size and in cost can be realized. As a result, since the area occupied by the distributed amplifier can be reduced, it becomes possible to realize very compact integrated circuit (IC) and module.

On the other hand, since each of the amplifier circuits 3 has a push-pull configuration and the signals dealt with by the respective transistor 3a and 3b are all either positive or negative, it is possible to increase the output that has been restricted in the conventional distributed amplifier because of the problem of withstand voltage. As a result, a higher output becomes possible and excellent linearity can be obtained (refer to FIG. 2). Further, excellent gain flatness can be obtained in a wide band (refer to FIG. 3). And, clipping can be alleviated and switching distortion can be eliminated by setting, for example, a bias etc. (refer to FIG. 4). Furthermore, power consumption can be reduced compared to the conventional distributed amplifier.

Others

In each of the above-mentioned embodiments, the push-pull amplifier circuit is configured as a complementary push-pull amplifier circuit comprising two transistors of different types (transistors in which channels of different conduction types are formed), however, the configuration is not limited to this.

For example, it may be possible to configure a push-pull amplifier circuit such that it comprises two n-channel type transistors [two transistors of the same type (transistors in which channels of the same conduction type are formed)] as a push side transistor and a pull side transistor. As an n-channel type transistor, it is only necessary to use a FET such as a MOS field-effect transistor (MOSFET), a junction FET, or a MIS (Metal Insulator Semiconductor) FET.

In this case, it is necessary to provide a phase inversion circuit for inverting the phase of a signal to be inputted to one of the n-channel type transistors with respect to the phase of a signal to be inputted to the other n-channel type transistor. As a phase inversion circuit, it is only necessary to provide, for example, a line (a phase delay circuit) for delaying the phase of an input signal on the line through which an input signal is inputted to one of the n-channel type transistors.

Here, two n-channel type transistors are used as a push-side transistor and a pull-side transistor, however, the configuration is not limited to this and two p-channel transistors [two transistors of the same type (transistors in which channels of the same conduction type are formed)] may be used. Further, two npn bipolar transistors (two transistors of the same type) may be used as a push-side transistor and a pull-side transistor or two pnp bipolar transistors (two transistors of the same type) may be used.

In each of the above-mentioned embodiments and their modification examples, a push-pull circuit comprising a field-effect transistor or a bipolar transistor (semiconductor amplifier element) is used, however, the configuration is not limited to this and, for example, an amplifier element having a different structure or made of a different material may be used or a push-pull circuit having a different configuration may be used.

The present invention is not limited by each of the above-mentioned embodiments and various modifications can be made without departing from the concept of the present invention.

What is claimed is:

1. A distributed amplifier comprising:
    an input side transmission line;
    an output side transmission line;
    plural push-pull amplifier circuits connected to said input side transmission line and said output side transmission line; and
    a constant-voltage power source capable of supplying a constant voltage;
    wherein each of said plural push-pull amplifier circuits has a push side transistor that is a field-effect transistor having a source, a drain and a gate and a pull side transistor that is a field-effect transistor having a source, a drain and a gate,
    said input side transmission line is directly connected to the gates of said push side transistor and said pull side transistor,
    said output side transmission line is directly connected to the source of said pull side transistor and to the drain of said push side transistor,
    said constant-voltage power source is directly connected to the drain of said pull side transistor,
    the source of said push side transistor is grounded, and
    wherein the plural push-pull amplifier circuits are not part of the output side transmission line.

2. The distributed amplifier according to claim 1, comprising:
    a push side input transmission line for inputting a signal to said push side transistor and a pull side input transmission line for inputting a signal to said pull side transistor as said input side transmission line; and
    a divider, provided on the input sides of said push side input transmission line and said pull side input transmission line, for dividing input signals such that in-phase input signals are inputted to said push side transistor and said pull side transistor.

3. The distributed amplifier according to claim 1, comprising a common input side transmission line connected to both said push side transistor and said pull side transistor as said input side transmission line.

4. The distributed amplifier according to claim 1, wherein:
    said push side transistor is an n-channel type transistor; and
    said pull side transistor is a p-channel type transistor.

5. The distributed amplifier according to claim 4, wherein:
    said n-channel type transistor is an n-channel type MOS field-effect transistor; and said p-channel type transistor is a p-channel type MOS field-effect transistor.

6. The distributed amplifier according to claim 1, wherein:
said push side transistor is an npn bipolar transistor; and
said pull side transistor is a pnp bipolar transistor.

7. The distributed amplifier according to claim 1, wherein one end of said input side transmission line is connected to an input terminal and the other end is grounded via a terminal resistor.

8. The distributed amplifier according to claim 1, wherein one end of said output side transmission line is connected to an output terminal and the other end is grounded via a terminal circuit.

9. A distributed amplifier comprising:
an input side transmission line;
an output side transmission line;
plural push-pull amplifier circuits connected to said input side transmission line and said output side transmission line; and
a constant-voltage power source capable of supplying a constant voltage;
wherein each of said plural push-pull amplifier circuits has a push side transistor that is a bipolar transistor having an emitter, a collector and a base and a pull side transistor that is a bipolar transistor having an emitter, a collector and a base,
said input side transmission line is directly connected to the bases of said push side transistor and said pull side transistor,
said output side transmission line is directly connected to the emitter of said pull side transistor and to the collector of said push side transistor,
said constant-voltage power source is directly connected to the collector of said pull side transistor,
the emitter of said push side transistor is grounded, and
wherein the plural push-pull amplifier circuits are not part of the output side transmission line.

10. The distributed amplifier according to claim 9, comprising:
a push side input transmission line for inputting a signal to said push side transistor and a pull side input transmission line for inputting a signal to said pull side transistor as said input side transmission line; and
a divider, provided on the input sides of said push side input transmission line and said pull side input transmission line, for dividing input signals such that in-phase input signals are inputted to said push side transistor and said pull side transistor.

11. The distributed amplifier according to claim 9, comprising a common input side transmission line connected to both said push side transistor and said pull side transistor as said input side transmission line.

12. The distributed amplifier according to claim 9, wherein:
said push side transistor is an npn bipolar transistor; and
said pull side transistor is a pnp bipolar transistor.

13. The distributed amplifier according to claim 9, wherein one end of said input side transmission line is connected to an input terminal and the other end is grounded via a terminal resistor.

14. The distributed amplifier according to claim 9, wherein one end of said output side transmission line is connected to an output terminal and the other end is grounded via a terminal circuit.

15. The distributed amplifier according to claim 2, wherein
an electrical length of a push side path and an electrical length of a pull side path from an input terminal to an output terminal of said distributed amplifier are set equal to each other such that amplified signals amplified by each of said plural push-pull amplifier circuits are mutually in-phase at an output terminal of each of said plural push-pull amplifier circuits, combine and amplified, and outputted as output signals.

16. The distributed amplifier according to claim 10, wherein
an electrical length of a push side path and an electrical length of a pull side path from an input terminal to an output terminal of said distributed amplifier are set equal to each other such that amplified signals amplified by each of said plural push-pull amplifier circuits are mutually in-phase at an output terminal of each of said plural push-pull amplifier circuits, combined and amplified, and outputted as output signals.

* * * * *